(12) United States Patent
Lee et al.

(10) Patent No.: US 10,739,301 B2
(45) Date of Patent: Aug. 11, 2020

(54) FIELD-EFFECT TRANSISTOR, BIOSENSOR COMPRISING THE SAME, METHOD OF MANUFACTURING FIELD-EFFECT TRANSISTOR, AND METHOD OF MANUFACTURING BIOSENSOR

(71) Applicant: KOREA INSTITUTE OF SCIENCE AND TECHNOLOGY, Seoul (KR)

(72) Inventors: Kwan Hyi Lee, Seoul (KR); Minhong Jeun, Seoul (KR); Seok Lee, Seoul (KR); Sang Kyung Kim, Seoul (KR); Sungwook Park, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 0 days.

(21) Appl. No.: 15/684,939

(22) Filed: Aug. 24, 2017

(65) Prior Publication Data

US 2018/0364194 A1 Dec. 20, 2018

(30) Foreign Application Priority Data

Jun. 16, 2017 (KR) .................. 10-2017-0076783

(51) Int. Cl.
 *H01L 29/45* (2006.01)
 *G01N 27/414* (2006.01)
(52) U.S. Cl.
 CPC ....... *G01N 27/414* (2013.01); *G01N 27/4145* (2013.01); *H01L 29/458* (2013.01)
(58) Field of Classification Search
 CPC .................................................. H01L 29/458
 See application file for complete search history.

(56) References Cited

U.S. PATENT DOCUMENTS

| 7,279,375 B2 | 10/2007 | Radosavljevic et al. |
| 7,872,728 B1 * | 1/2011 | Yasukawa ........... G02F 1/13454 |
| | | 349/113 |
| 8,203,264 B2 | 6/2012 | Kang et al. |

(Continued)

FOREIGN PATENT DOCUMENTS

| KR | 100685841 B1 | 2/2007 |
| KR | 1020080024168 A | 3/2008 |
| KR | 1020160087709 A | 7/2016 |

OTHER PUBLICATIONS

Korean Office Action for corresponding Korean Patent Application No. 10-2017-0076783 dated May 3, 2018.

*Primary Examiner* — Errol V Fernandes
(74) *Attorney, Agent, or Firm* — Cantor Colburn LLP

(57) ABSTRACT

Provided is a field-effect transistor that can reduce noise, be produced by a simplified manufacturing method, and also have a plurality of active patterns and gate patterns designed to be combinable according to a detection purpose. The field-effect transistor includes a lower silicon layer and a buried oxide layer disposed on the lower silicon layer; an active pattern disposed on the buried oxide layer and including a channel region, a source region, and a drain region; a gate pattern disposed on the active pattern to at least partially overlap the active pattern; a source electrode disposed in direct contact with the source region on the active pattern, and a drain electrode disposed in direct contact with the drain region on the active pattern; and a gate insulating film disposed between the active pattern and the gate pattern.

9 Claims, 19 Drawing Sheets

(56) References Cited

U.S. PATENT DOCUMENTS

| | | | |
|---|---|---|---|
| 9,741,812 B1* | 8/2017 | Adusumilli | H01L 29/41791 |
| 2002/0123048 A1* | 9/2002 | Gau | B01L 3/5088 |
| | | | 435/6.11 |
| 2003/0201494 A1* | 10/2003 | Maeda | H01L 21/84 |
| | | | 257/347 |
| 2005/0285156 A1* | 12/2005 | Ugawa | H01L 51/0051 |
| | | | 257/256 |
| 2006/0284550 A1 | 12/2006 | Takeguchi et al. | |
| 2007/0007606 A1* | 1/2007 | Shin | H01L 29/66583 |
| | | | 257/412 |
| 2008/0099849 A1* | 5/2008 | Kim | H01L 29/42392 |
| | | | 257/365 |
| 2011/0272753 A1* | 11/2011 | Funayama | H01L 27/11565 |
| | | | 257/299 |
| 2016/0202208 A1 | 7/2016 | Lee et al. | |

* cited by examiner

FIELD-EFFECT TRANSISTOR, BIOSENSOR COMPRISING THE SAME, METHOD OF MANUFACTURING FIELD-EFFECT TRANSISTOR, AND METHOD OF MANUFACTURING BIOSENSOR

BACKGROUND

1. Technical Field

The present invention relates to a field-effect transistor, a biosensor including the field-effect transistor, a method of manufacturing the field-effect transistor, and a method of manufacturing the biosensor, and more particularly, to a field-effect transistor that may reduce noise, have a simplified manufacturing method, and also have a plurality of active patterns and gate patterns which are designed to be combinable according to a detection purpose, a biosensor including the field-effect transistor, a method of manufacturing the field-effect transistor, and a method of manufacturing the biosensor.

2. Description of Related Art

An ion-sensitive field-effect transistor (ISFET) is an electrochemical sensor capable of sensitively detecting a signal originating from an interaction between a biological sample and an analyte and accurately converting the signal into an electric signal. Until now, ISFETs based on carbon nanotubes (CNTs), graphenes, or nanowires (NWs) have been attracting attention as diagnostic devices (or biosensors) for quick and easy regular medical examination because they have desirable characteristics such as quick detection times, low manufacturing costs, high reliability, label-free detectability, multi-detectability, and portability. However, since ISFETs are driven in a single gate operation mode and their sensitivity is determined only by a change in surface potential of a sensing membrane, their clinical applications have been limited only to pH sensors.

To address this, Mark-Jan Spijkman proposed a dual-gate (DG) ISFET with a lower electrode added to a pre-existing ISFET, which has increased sensitivity in comparison to a pre-existing ISFET. However, despite high sensing characteristics of DG ISFETs, small-scale research has been conducted at only the laboratory level, and also there is an emerging issue about reproducibility and stability due to small scale production of devices.

Thus, the present inventors completed the present invention by developing a field-effect transistor capable of being mass produced in the form of a commercial chip and a manufacturing method thereof.

SUMMARY

1. Technical Problem

A technical objective of the present invention is to provide a field-effect transistor with reduced noise by accurately defining a length and implementing a flat channel region to minimize scattering accompanied by movement of electrons.

Another technical objective of the present invention is to provide a field-effect transistor manufacturing method that can reduce a photolithography process and accurately define a length of a channel region by applying a gate first process to self-align a gate.

Yet another technical objective of the present invention is to provide a biosensor including a field-effect transistor having various structures by designing a plurality of active patterns and gate patterns to be combinable according to a detection purpose.

2. Solution to Problem

According to an aspect of the present invention, a field-effect transistor includes a lower silicon layer and a buried oxide layer (BOX) disposed on the lower silicon layer; an active pattern disposed on the buried oxide layer and including a channel region, a source region, and a drain region; a gate pattern disposed on the active pattern to at least partially overlap the active pattern; a source electrode disposed in direct contact with the source region on the active pattern and a drain electrode disposed in direct contact with the drain region on the active pattern; and a gate insulating film disposed between the active pattern and the gate pattern.

In this embodiment, a side surface of the gate insulating film and a side surface of the gate pattern may be coplanar.

In this embodiment, the active pattern may include the channel region and have a bridge that connects the source region and the drain region, and the bridge may have a width of 20 to 60 μm.

In this embodiment, the channel region may include a plurality of bridges.

In this embodiment, the source electrode and the drain electrode may include TiN.

In this embodiment, each of the source electrode and the drain electrode may be formed by sequentially stacking a first layer including Ti, a second layer including TiN, a third layer including Al, and a fourth layer including TiN.

In this embodiment, the active pattern may have a thickness of 30 to 100 nm.

In this embodiment, the gate insulating film may have a thickness of 10 to 20 nm.

In this embodiment, the gate pattern may include a first gate region disposed at one side of the active pattern and a second gate region extending from the first gate region to the active pattern to at least partially overlap the channel region, and the second gate region may have a width of 5 to 30 μm.

According to another aspect of the present invention, a biosensor includes an electrochemical sensing unit configured to detect an analyte in a sample and a field-effect transistor electrically connected to the electrochemical sensing unit and configured to amplify a signal generated by the electrochemical sensing unit.

According to another aspect of the present invention, a method of manufacturing a field-effect transistor includes preparing a silicon substrate including a lower silicon layer, an upper silicon layer disposed above the lower silicon layer, and a buried oxide layer disposed between the lower silicon layer and the upper silicon layer; forming an active pattern including a channel region, a source region, and a drain region by patterning the upper silicon layer; forming a gate insulating film on the active pattern; forming a gate pattern on the active pattern to at least partially overlap the active pattern; and forming a source electrode in direct contact with the source region on the active pattern and forming a drain electrode in direct contact with the drain region on the active pattern.

In this embodiment, the forming of a gate pattern may include simultaneously forming the gate insulating film and the gate pattern through patterning.

In this embodiment, in the forming of an active pattern, the channel region may include a bridge that connects the source region and the drain region, and the bridge may have a width of 20 to 60 μm.

In this embodiment, in the forming of an active pattern, the channel region may include a plurality of bridges.

In this embodiment, the gate pattern, the source electrode, and the drain electrode may include TiN.

In this embodiment, the forming of a source electrode and a drain electrode may include forming a first layer including Ti; forming a second layer including TiN on the first layer; forming a third layer including Al on the second layer, and forming a fourth layer including TiN on the third layer.

In this embodiment, the method may further include performing a thinning process for forming a thickness of the upper silicon layer in a range of from 30 nm to 100 nm before the forming of an active pattern.

In this embodiment, the forming of a gate pattern may include forming a thickness of the gate insulating film in a range of from 10 nm to 20 nm.

In this embodiment, in the forming of a gate pattern, the gate pattern may include a first gate region disposed at one side of the active pattern and a second gate region extending from the first gate region to the active pattern to at least partially overlap the channel region, and the second gate region may have a longitudinal width of 5 to 30 μm.

According to another aspect of the present invention, a method of manufacturing a biosensor includes forming an electrochemical sensing unit configured to detect an analyte in a sample; and forming a field-effect transistor electrically connected to the electrochemical sensing unit and configured to amplify a signal generated by the electrochemical sensing unit by any one of the above-described methods.

The above and other aspects, features, and advantages of the present invention will become apparent from the following description taken in conjunction with the accompanying drawings, claims, and detailed description.

These general and specific aspects may be carried out by using a system, a method, a computer program, or a combination thereof.

3. Advantageous Effects

According to an embodiment of the present invention that is implemented as described above, it is possible to implement a field-effect transistor that can reduce noise, have a simplified manufacturing method, and also have a plurality of active patterns and gate patterns which are designed to be combinable according to a detection purpose, a biosensor including the field-effect transistor, a method of manufacturing the field-effect transistor, and a method of manufacturing the biosensor. It should be appreciated that the present invention is not limited to these advantageous effects.

DETAILED DESCRIPTION OF EMBODIMENTS

Figure 1A:
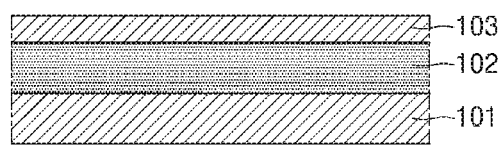
FIGS. 1A to 1H are cross-sectional views and plan views schematically showing a method of manufacturing a field-effect transistor according to an embodiment of the present invention.

While the present invention is susceptible to various modifications and alternative forms, specific embodiments thereof are shown by way of example in the drawings and will herein be described in detail. Advantages and features of the present invention and implementation methods thereof will be clarified through the following embodiments described with reference to the accompanying drawings. However, the present invention is not limited to the following embodiments, and may be implemented in various forms.

Hereinafter, embodiments of the present invention will be described in detail with reference to the accompanying drawings, and the same or similar elements will be designated with the same references numbers regardless of the numbers in the drawings, and redundant descriptions thereof will be omitted.

It should be understood that although the terms "first," "second," etc. may be used herein to describe various components, these components are not limited by these terms. These components are only used to distinguish one component from another. The singular forms "a," "an," and "the" include the plural form unless the context clearly dictates otherwise.

It should be further understood that the terms "comprises" and/or "comprising" used herein specify the presence of stated features or components, but do not preclude the presence or addition of one or more other features or components. It should be understood that when a layer, region, or component is referred to as being "formed on" another layer, region, or component, the region can be directly or indirectly formed on the other layer, region, or component. That is, for example, intervening layers, regions, or components may be present.

Additionally, sizes of components depicted in the drawings may be exaggerated or reduced for convenience of explanation. For example, since sizes and thicknesses of components in the drawings are arbitrarily illustrated for convenience of explanation, the following embodiments are not limited thereto.

An x-axis, a y-axis, and a z-axis are not limited to three axes of a rectangular coordinate system, and may be interpreted in a broader sense. For example, the x-axis, the y-axis, and the z-axis may be perpendicular to each other, or may represent different directions that are not perpendicular to each other.

When a certain embodiment may be implemented differently, a specific process order may be performed differently from the described order. For example, two consecutively described processes may be performed substantially at the same time or performed in an order opposite to the described order.

FIGS. 1A to 1H are cross-sectional views and plan views schematically showing a method of manufacturing a field-effect transistor according to an embodiment of the present invention.

First, referring to FIG. 1A, a step of preparing a silicon substrate 100 including a lower silicon layer 101, an upper silicon layer 103' disposed above the lower silicon layer 101, and a buried oxide layer 102 disposed between the lower silicon layer 101 and the upper silicon layer 103' may be carried out. In this embodiment, p-Si is used for the lower silicon layer 101 and the upper silicon layer 103'. However, n-Si may be used in other embodiments. In this embodiment, a Si-on-insulator (SOI) substrate is used as the silicon substrate 100. However, a Ge-on-insulator (GOI) substrate may be used in other embodiments.

In this embodiment, a step of performing a thinning process may be carried out so that the upper silicon layer 103' has a thickness in a range of from 30 nm to 100 nm. Before the thinning process is performed, the upper silicon layer 103' may have a thickness of 150 nm or more, and the upper silicon layer 103' may be formed as a thin film through the thinning process. In detail, the thinning process may be carried out in the range of from 30 nm to 100 nm by alternately oxidizing and etching the upper silicon layer 103' of the silicon substrate 100.

An advantage in which sensitivity of a field-effect transistor increases as a thickness of a channel region of an active pattern of the field-effect transistor decreases may be obtained. Accordingly, in a pre-existing transistor, a channel region of an active pattern is formed to be much thinner than a source region or a drain region. In this case, it is possible to achieve high sensitivity in the transistor. However, when the thickness of the channel region of the active pattern is reduced, the channel region is easily broken while operating, which causes a serious problem in device stability.

According to the field-effect transistor according to an embodiment of the present invention, it is possible to produce an active pattern 103 that is uniformly flat and well-defined, and thus increase device stability by generally adjusting the thickness of the upper silicon layer 103' to be patterned in the active pattern 103 before the active pattern 103 is formed through the thinning process.

Figure 1B:
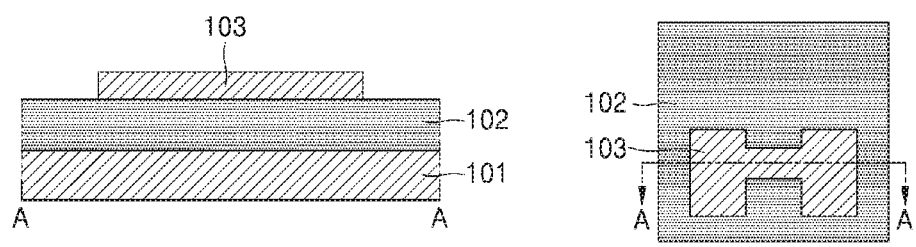

Subsequently, as shown in FIG. 1B, the upper silicon layer 103' may be patterned to form the active pattern 103. The active pattern 103 may be formed through a photo-lithography process. A process such as dry-etching (ICP RIE, 100 nm) may be additionally performed.

Figure 1C:
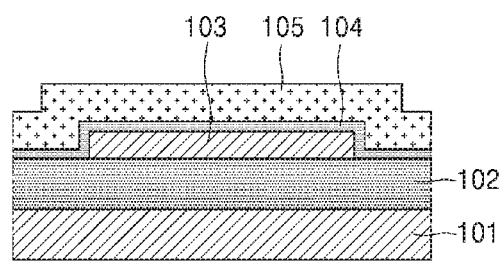

Subsequently, as shown in FIG. 1C, a step of forming a gate insulating film 104 on the active pattern 103 may be carried out. The gate insulating film 104 may be formed as a single layer or multiple layers of a material such as silicon oxide or silicon nitride to secure insulation between the active pattern 103 and a gate pattern 105 to be described below. For example, the gate insulating film 104 may be formed to a thickness of about 10 to 20 nm by carrying out a dry oxidation process in a furnace.

A step of depositing a gate metal layer 105' for forming the gate pattern 105 on the gate insulating film 104 may be carried out. The gate pattern 105 may be formed as a single layer or multiple layers of one or more materials selected from among, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu) in consideration of conductivity or the like. In this embodiment, the gate pattern 105 may include TiN. Preferably, Ti, TiN, Al, and TiN may be formed as a layered structure with thicknesses of 50 nm, 50 nm, 250 nm, and 50 nm, respectively. However, the present invention is not limited thereto.

Figure 1D:
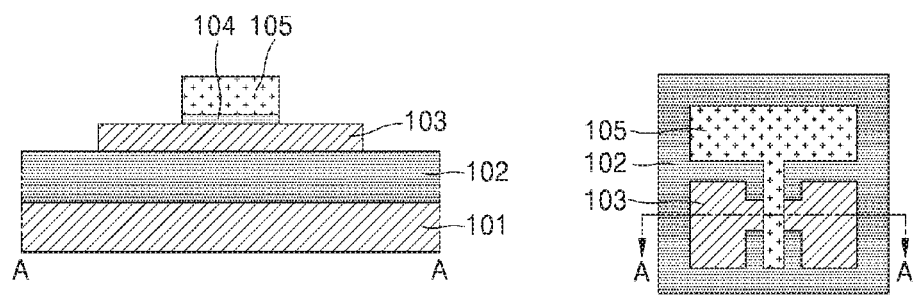

Subsequently, as shown in FIG. 1D, a step of patterning both the gate insulating film 104 and the gate metal layer 105' to form the gate pattern 105 may be carried out. In this case, the gate pattern 105 may be formed to at least partially overlap the active pattern 103.

In detail, when the gate pattern 105 is formed, Poly-Si is deposited thereon to a thickness of about 150 to 300 nm (preferably, 200 nm) using low-pressure chemical vapor deposition (LPCVD). Subsequently, the gate pattern 105 is formed through photolithography, and an exposed gate insulating film 104 formed of Poly-Si is etched using ICP-RIE (ICP RIE, 200/10 nm). As described above, the gate pattern 105 according to this embodiment is formed to include TiN, which can endure a temperature of 1000° C. that is applied when the process is performed. However, the present invention is not limited thereto.

Figure 1E:
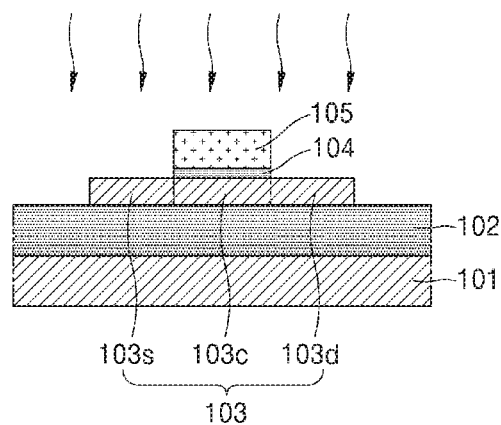
Figure 1F:
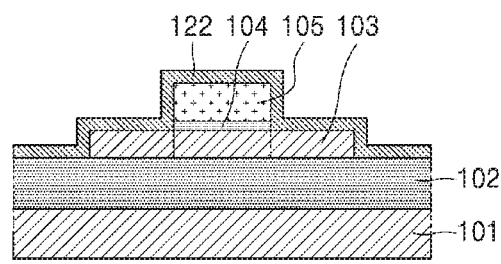

Subsequently, as shown in FIGS. 1E and 1F, ions may be injected into the active pattern 103 to form a channel region 103c, a source region 103s, and a drain region 103d. In this case, a portion of the active pattern 103 that overlaps the gate pattern 105 may be defined as the channel region 103c, and a portion of the active pattern 103 that does not overlap the gate pattern 105 may be defined as the source region 103s or the drain region 103d.

In detail, a capping oxide layer (not shown) is deposited above the gate pattern 105 to a thickness of about 40 to 60 nm (preferably, 50 nm) using plasma-enhanced chemical vapor deposition (PECVD), an ion injection region is formed through photo-lithography, and then ions are injected at a power of 100 keV and a concentration of 3E15. In this embodiment, arsenic (As) is used as the ions, but the present invention is not limited thereto. Subsequently, heat treatment is carried out at a temperature of about 1000 to 1100° C. (preferably, 1050° C.) for 10 seconds in rapid thermal annealing (RTA), and then the capping oxide layer may be etched to a thickness of 50 nm using reactive-ion etching (RIE).

Figure 1G:
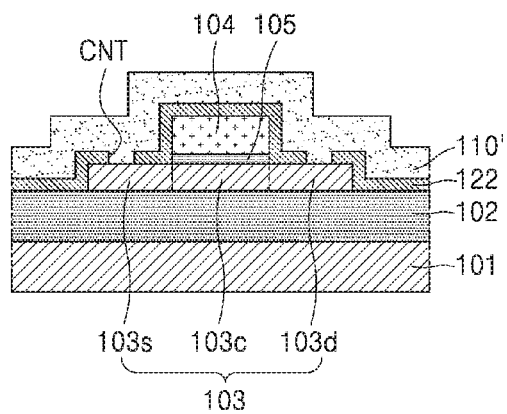
Figure 1H:
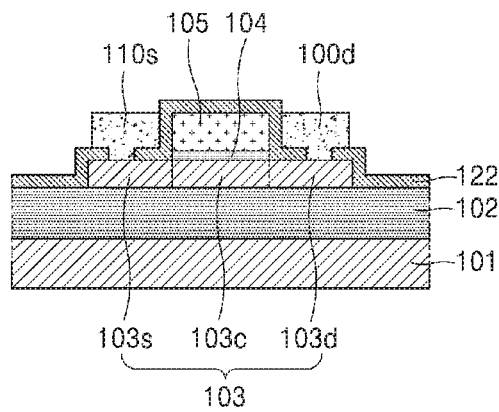

Subsequently, as shown in FIGS. 1G and 1H, a step of forming a contact hole to expose the source region 103s and the drain region 103d of the active pattern 103 and then forming a source electrode 110s in contact with the source region 103s of the active pattern 103 and a drain electrode 110d in contact with the drain region 103d of the active pattern 103 may be carried out.

In detail, a passivation oxide film 122 is deposited to a thickness of about 300 to 500 nm (preferably, 400 nm) using PECVD. Subsequently, a contact hole is formed on the passivation oxide film 122 through photo-lithography to expose the source region 103s and the drain region 103d of the active pattern 103, and then the passivation oxide film 122 is etched (ICP RIE, 400 nm). Subsequently, a metal layer 110' is deposited to be in contact with the source region 103s and the drain region 103d of the active pattern through the contact hole, and then the source region 103s and the drain region 103d are patterned as the source electrode 110s and the drain electrode 110d, respectively, using photolithography. Subsequently, annealing (in a furnace, H2, 450 C 30 min) is carried out to increase stability of a device such as the active pattern 103.

Figure 2:
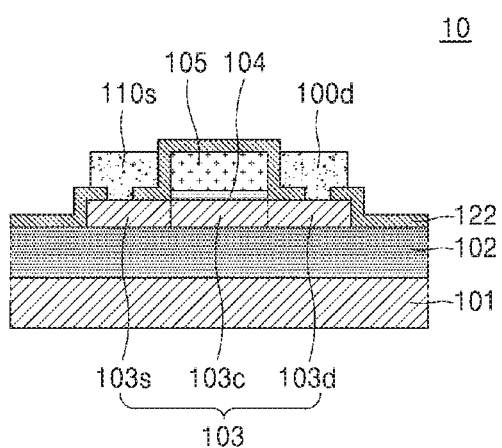
FIG. 2 is a cross-sectional view schematically showing a field-effect transistor according to an embodiment of the present invention.

FIG. 2 is a cross-sectional view schematically showing a field-effect transistor according to an embodiment of the present invention.

Referring to FIG. 2, a field-effect transistor according to an embodiment of the present invention includes a lower silicon layer 101, a buried oxide layer (BOX) 102 disposed on the lower silicon layer 101, an active pattern 103 disposed on the buried oxide layer 102 and including a channel region 103c, a source region 103s, and a drain region 103d, a gate pattern 105 disposed on the active pattern 103 to at least partially overlap the active pattern 103, a source electrode 110s disposed in direct contact with the source region 103s on the active pattern 103, a drain electrode 110d disposed in direct contact with the drain region 103d on the active pattern 103, and a gate insulating film 104 disposed between the active pattern 103 and the gate pattern 105.

A conventional field-effect transistor has disadvantages of: (1) a reduction of sensitivity and stability due to a U-shaped channel structure; (2) an implementation on a small wafer of 1 mm×1 mm (low reproducibility and prevention of mass production); (3) a poly-Si electrode (prevention of implementation in the form of a chip); (4) a gate-last process (a reduction of sensitivity and stability due to an unclear channel region 103c); and (6) a thin channel structure (a high defect rate and a low use time).

On the other hand, the field-effect transistor according to this embodiment has advantages of: (1) an introduction of a 6-inch wafer process (allowing mass production); (2) an introduction of a metal contact (allowing implementation in the form of a chip); (3) an increase and optimization of a Top Si thickness (an increase of stability); (4) a straight channel (an improvement of sensitivity and a reduction of noise); (5) a gate-first process (an increase of stability and sensitivity by establishing a clear channel region 103c; and (6) a guarantee of device stability and reliability due to an increased channel thickness.

In this embodiment, a side surface of the gate insulating film 104 and a side surface of the gate pattern 105 may be coplanar. It can be seen that this is caused because the gate insulating film 104 and the gate pattern 105 are simultaneously patterned as described above in the manufacturing method of FIG. 1.

Also, the channel region 103c may have a length of about 10 to 100 um. As described above, the active pattern 103 may have a length of about 30 to 100 nm or may be formed as an ultra-thin film layer. For example, the active pattern 103 may have a thickness of about 50 nm to about 4 nm, 10 nm or less, 9 nm or less, 8 nm or less, 7 nm or less, 6 nm or less, or 5 nm or less. Accordingly, the active pattern 103 may have a thickness of about 4 to 100 nm.

In this embodiment, the lower silicon layer 101 that is described above may act as a lower gate. That is, the lower silicon layer 101 and the gate pattern 105 may act as a lower gate (hereinafter referred to as a lower gate) and an upper gate (hereinafter referred to as an upper gate), respectively, and thus may be operated as a dual gate.

In the range of the thickness of the active pattern 103, super capacitive coupling that may control up to an upper interface under any condition is generated due to a strong electric field of the lower gate applied to a ultra-thin film body. Thus, it is possible to control electrons and holes applied to an upper gate interface and prevent a leakage current. It is also possible to allow an amplification factor to be stable, thus improving a linear response, hysteresis, and a drift phenomenon caused by a surface potential and maintaining electrostatic coupling between upper and lower gates.

Also, a transistor including the ultra-thin active pattern 103 may increase ion-sensing ability within the range of the thickness of the active pattern 103 while allowing a large amplification factor in comparison to a pre-existing transistor.

Also, a transistor including the ultra-thin active pattern 103 can enhance stability within the range of the thickness of the active pattern 103 in comparison to a pre-existing transistor. A changing amplification factor that is shown in the thick active pattern 103 may cause deterioration of a device due to ionic damage together with a factor of a leakage current applied to an upper interface thereof. However, the transistor according to this embodiment may control a leakage current while allowing a constant amplification factor, thus minimizing ionic damage.

Also, when a conventional transistor has an excessively thick lower insulating film, a lower electric field cannot control the whole channel region 103c, and thus electrostatic coupling between upper and lower gate patterns 105 may be weakened. However, a transistor including the ultra-thin active pattern 103 according to this embodiment may obtain a large amplification factor while maintaining the electrostatic coupling. The electrostatic coupling between the upper and lower gate patterns 105 is generated when the upper channel interface is completely depleted, and since an electric field of the lower gate pattern 105 cannot control an upper channel in a pre-existing transistor, an amplification phenomenon does not occur.

The active pattern 103 according to this embodiment may include any one selected from a group consisting of oxide semiconductor, organic semiconductor, polycrystalline silicon, and monocrystalline silicon. When the active pattern 103 includes any one selected from the group consisting of a semiconductor, an organic semiconductor, a polycrystalline silicon, and a monocrystalline silicon, it is possible to generate electrostatic coupling between upper and lower gates thereof, produce a high sensitivity sensor, and provide a transparent and flexible sensor. The active pattern 103 has no limitation in area or length, and a dual gate structure may utilize an electrostatic coupling phenomenon using the upper and lower gate patterns 105.

Also, in the transistor, the lower buried oxide layer 102 may have a thickness of about 300 to 500 nm or about 500 nm to 1 um. Also, the gate insulating film 104 may have a smaller equivalent oxide thickness than the lower insulating film. For example, the gate insulating film 104 may have a thickness of about 25 nm or less, and the lower insulating film may have a thickness of about 50 nm or more. When the gate insulating film 104 has a smaller equivalent oxide thickness than the lower insulating film, signal sensitivity may be amplified.

The gate insulating film 104 and the lower insulating film may include an oxide layer that is naturally or artificially formed. Examples of the oxide layer may include $Si_xO_y$, $Hf_xO_y$, $Al_xO_y$, $Ta_xO_y$, or $Ti_xO_y$ (here x and y are integers ranging from 1 to 5). The oxide layer may have a single-, double-, or triple-layered structure. Thus, it is possible to increase a physical thickness thereof and decrease the equivalent oxide thickness of the gate insulating film 104, thereby amplifying sensor sensitivity and preventing deterioration due to a leakage current. Also, the gate pattern 105 may be formed of Ti, TiN, Al, TiN, or a combination thereof.

The field-effect transistor according to this embodiment may have a structure including both a field transistor including the gate insulating film 104 therein and a lower field transistor including the BOX 102. According to each operation mode, the field-effect transistor may independently operate as upper and lower gates. When upper or lower gates of a device are used at the same time, electrostatic coupling may be observed due to structural characteristics of a dual gate structure thereof, and a correlation between upper and lower field transistors may be established. The lower gate may be used as a main gate in a dual operating mode. Accordingly, the transistor according to this embodiment may operate in a dual gate mode.

Figure 3A:
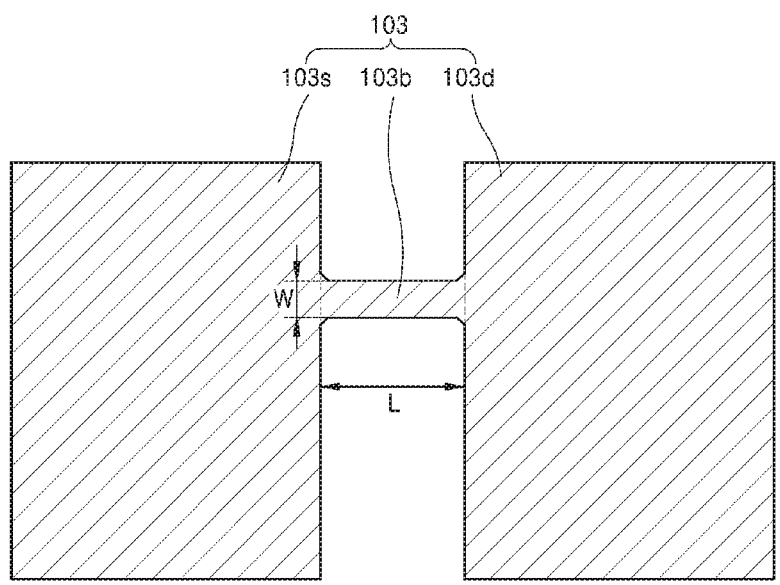
FIGS. 3A to 3C are plan views schematically showing an active pattern according to an embodiment of the present invention.
Figure 3B:
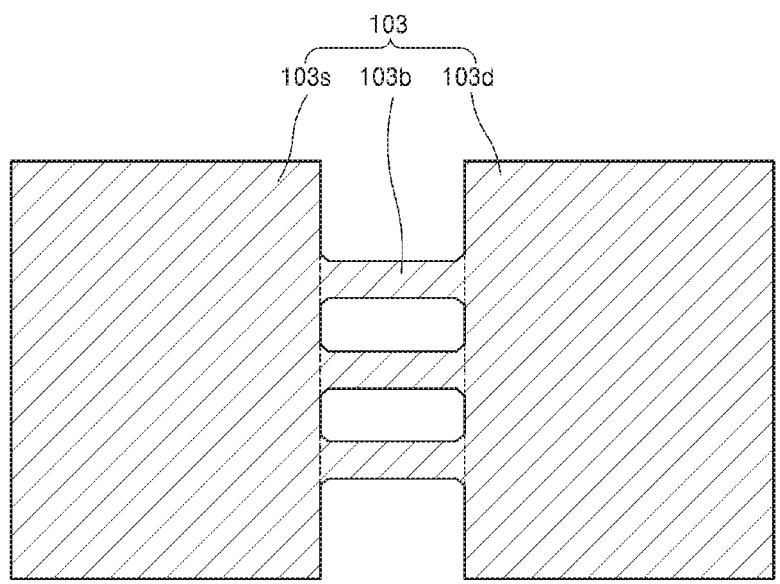
Figure 3C:
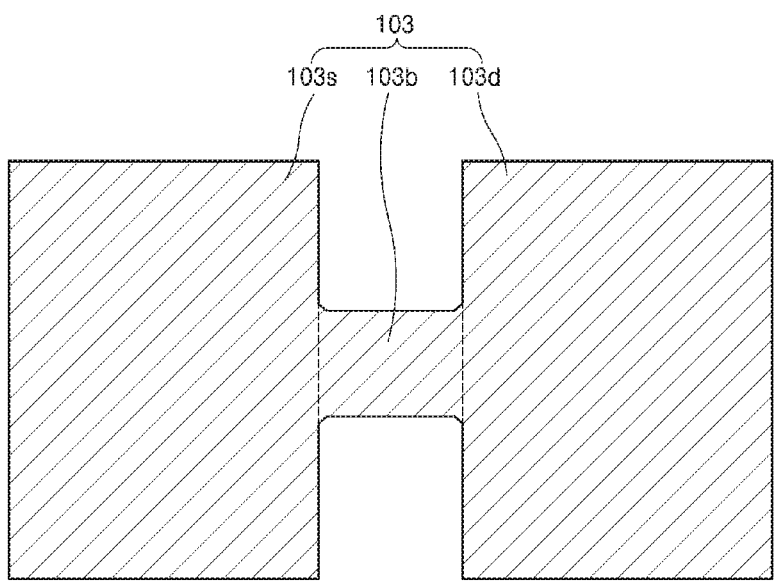
Figure 4A:
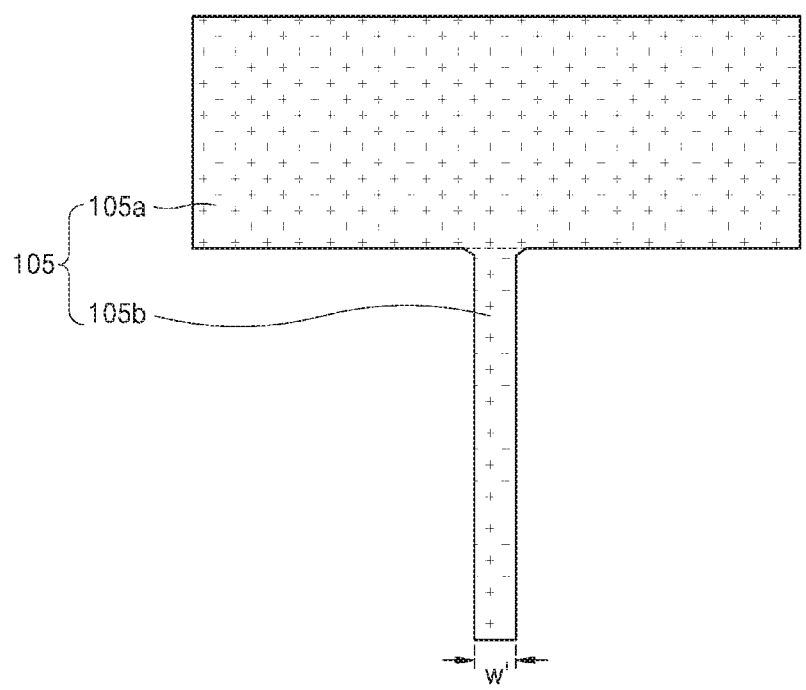
FIGS. 4A to 4D are plan views schematically showing a gate pattern according to an embodiment of the present invention.
Figure 4B:
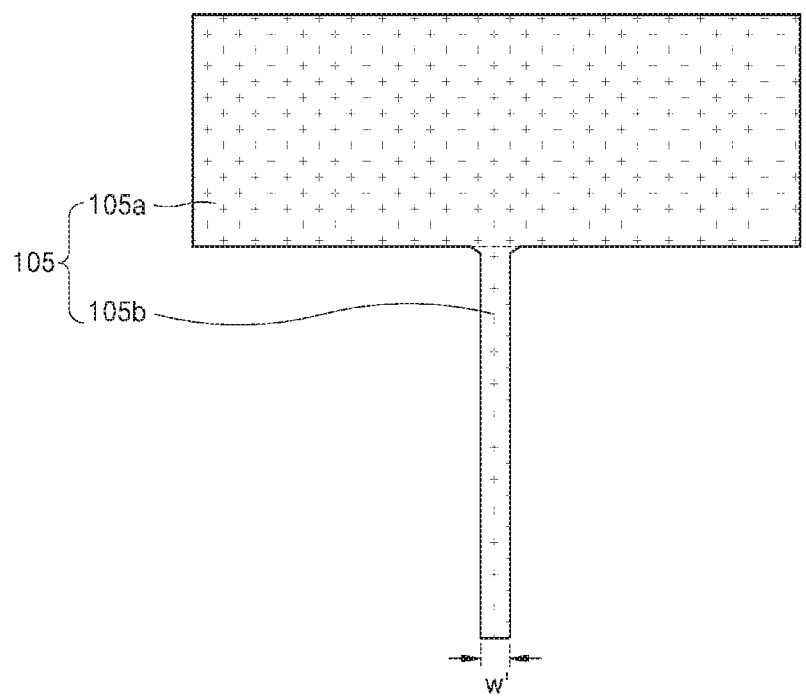
Figure 4C:
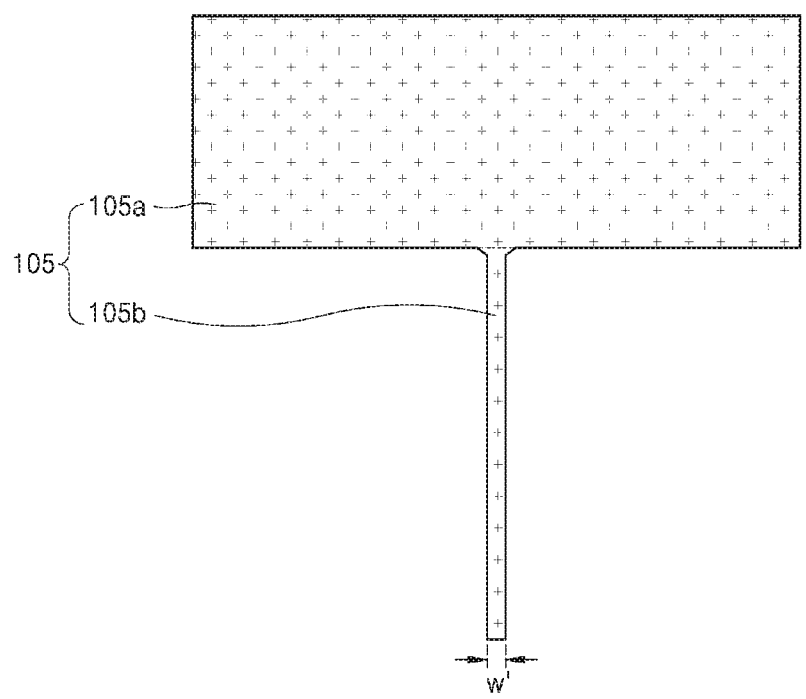
Figure 4D:
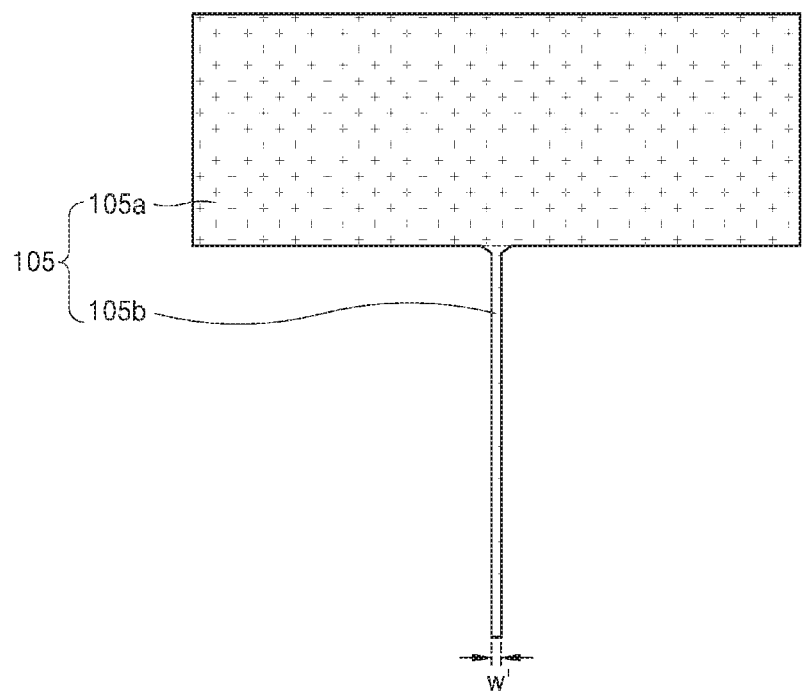

FIGS. 3A to 3C are plan views schematically showing the active pattern 103 according to an embodiment of the present invention.

FIGS. 3A to 3C are views showing various active patterns 103 seen from above according to this embodiment. The active pattern 103 has a bridge that connects the source region 103s and the drain region 103d and includes the channel region 103c. In this embodiment, the bridge may have a width of about 20 to 60 μm.

Referring to FIGS. 3A to 3C, the active pattern 103 according to this embodiment may be formed with a size of, for example, about 420 um×230 um. In this case, the active pattern 103 may have three patterns.

For example, as shown in FIG. 3A, the active pattern 103 may have one bridge 103b, and the bridge 103b may have a length L of about 70 to 80 um and a longitudinal width W of about 20 to 30 um. Also, as shown in FIG. 3B, the channel region 103c may have a plurality of bridges 103b. Also, as shown in FIG. 3C, one bridge 103b may have the length L of about 70 to 80 um and a width W of about 60 to 70 um.

FIGS. 4A to 4D are plan views schematically showing the gate pattern 105 according to an embodiment of the present invention.

FIGS. 4A to 4D are views showing various gate patterns 105 seen from above according to this embodiment. Referring to FIGS. 4A to 4D, the gate pattern 105 according to this embodiment may have four patterns. The gate pattern 105 may include a first gate region 103a disposed at a side of the active pattern 103 and a second gate region 103b extending from the first gate region 103a to the active pattern 103 to at least partially overlap the channel region 103c. In this case, the second gate region 103b may have a width W' of, for example, about 5 to 30 μm. In detail, in embodiments of FIGS. 4A, 4B, 4C, and 4D, the second gate region 103b may have widths W' of 30 μm, 20 μm, 10 μm, and 5 μm, respectively.

Accordingly, referring to FIGS. 3 and 4, the field-effect transistor according to this embodiment has three active patterns 103 and four gate patterns 105, and thus a total of 12 field-effect transistors may be produced. This is so that selection according to the type of biomarker and a specimen (e.g., PBS, DI water, urine, stool, serum, whole blood, sputum, tear, sweat, and so on) to be detected is allowed. Also, this allows selection of a structure suitable for a user's purpose, for example, a channel structure having high sensitivity to detect a trace volume of a biomarker, a channel structure having low sensitivity but high stability, and a multi-channel structure for detecting a plurality of biomarkers.

The field-effect transistor 10 has been mainly described, but the present invention is not limited thereto. For example, it should be appreciated that a biosensor equipped with the field-effect transistor 10 also falls within the scope of the present invention.

Figure 10:
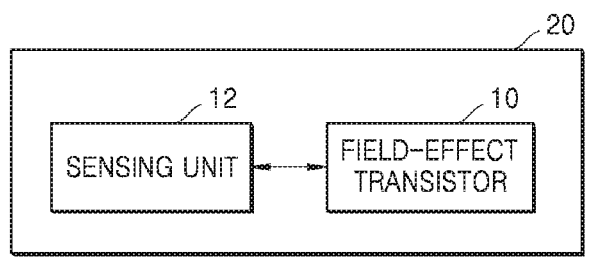
FIG. 10 is a conceptual view schematically showing a biosensor according to an embodiment of the present invention.

FIG. 10 is a conceptual view schematically showing a biosensor according to an embodiment of the present invention.

A biosensor including the field-effect transistor 10 according to this embodiment will be described in detail with reference to FIG. 10. A biosensor 20 includes an electrochemical sensing unit 12 (hereinafter also referred to as a sensing unit 12) for detecting an analyte in a sample, and the field-effect transistor 10 electrically connected with the sensing unit 12 to amplify a signal generated by the sensing unit 12.

The field-effect transistor 10 is as described above.

A gate pattern of the field-effect transistor 10 may be connected with an electrode of the sensing unit 12.

The sensing unit 12 may include a substrate, a working electrode and a reference electrode formed on the substrate, an analyte binding material immobilized on the working electrode, and a test cell configured to accommodate the analyte binding material and an analyte. Generally, the sensing unit 12 may be configured to be disposable.

For example, the substrate may be formed of a material selected from a group consisting of silicon, glass, a metal, a plastic, and a ceramic. In detail, the substrate may be formed of a material selected from a group consisting of silicon, glass, polystyrene, poly(methyl acrylate), polycarbonate, and a ceramic. Examples of the electrode may include titanium nitride, silver, silver epoxy, palladium, copper, gold, platinum, silver/silver chloride, silver/silver ions, or mercury and mercury oxide. Also, the sensing unit 12 may include an insulated electrode formed on the substrate or the working electrode. The insulated electrode may include an oxide layer that is naturally or artificially formed. Examples of the oxide layer may include $Si_xO_y$, $Hf_xO_y$, $Al_xO_y$, $Ta_xO_y$, or $Ti_xO_y$ (here x and y are integers ranging from 1 to 5).

In this specification, the terms "analyte binding material" and "analyte binding reagent" may be used interchangeably and may refer to a material capable of providing functionalization to the sensing unit 12 or an analyte-specific binding material. The analyte binding material may include deoxyribonucleic acid (DNA), ribonucleic acid (RNA), nucleotides, nucleosides, proteins, polypeptides, peptides, amino acids, carbohydrates, enzymes, antibodies, antigens, receptors, viruses, substrates, ligands or membranes, or a combination thereof. For example, the analyte binding material may be an antibody capable of specifically binding to colon cancer secreted protein (CCSP), which is a marker for diagnosing colon cancer, for example, CCSP-2 or carcinoembryonic antigen (CEA). Accordingly, the sensing unit 12 may be, for example, a sensor for detecting a colon cancer biomarker (e.g., CCSP or CEA), an influenza virus (e.g., H5N1), or a prostate cancer diagnosis biomarker (e.g., prostate specific antigen (PSA)). Also, the analyte binding material may include a redox enzyme. The redox enzyme may refer to an enzyme that catalyzes an oxidation-reduction reaction between substrates. For example, the redox enzyme may include oxydase, peroxidase, reductase, catalase, or dihydrogenase. Examples of the redox enzyme may include glucose oxidase, lactate oxidase, cholesterol oxidase, glutamate oxidase, horseradish peroxidase (HRP), alcohol oxidase, glucose oxidase (GOx), glucose dehydrogenase (GDH), cholesterol ester genase, ascorbic acid oxidase, alcohol dehydrogenase, laccase, tyrosinase, galactose oxidase, or bilirubin oxidase. The analyte binding material may be immobilized on the substrate, the working electrode, or the insulated electrode, and the term "immobilized" may refer to chemical or physical binding between an analyte binding material and a substrate. Also, an immobilization compound may be immobilized on the substrate or the electrode. The immobilization compound may refer to a material capable of binding to an analyte or a linker for immobilizing an analyte binding material on a surface of a substrate or an electrode. The immobilization compound may include compounds having biotin, avidin, streptavidin, a carbohydrate, poly-1-lysine, a hydroxyl group, a thiol group, an amine group, an alcohol group, a carboxyl group, an amino group, a sulfide group, an aldehyde group, a carbonyl group, a succinimide group, a maleimide group, an epoxy group, an isothiocyanate group, or a combination thereof.

In this specification, the term "analyte" may refer to a material of interest that may be present in a sample. A detectable analyte may include things that may be associated with a specific-binding interaction with one or more analyte binding materials capable of participating in a sandwich, competition, or substitution analysis configuration. Examples of the analyte may include haptens or antigens such as peptides (e.g., hormones), proteins (e.g., enzymes), carbohydrates, proteins, drugs, pesticides, microbes, antibodies, and a nucleic acid capable of participating in a sequence-specific hybridization reaction with a complementary sequence. Detailed examples of the analyte may include CCSP (e.g., CCSP-2 or CEA), which is a colon cancer biomarker, an influenza virus (e.g., H5N1), or a prostate cancer diagnosis biomarker (e.g., PSA).

The sample may be a biological sample derived from an individual, such as a mammal, including a human. Also, the biological sample may include blood, whole blood, blood serum, blood plasma, lymph, urine, feces, tissue, cells, organs, bone marrow, saliva, sputum, cerebrospinal fluid, or a combination thereof.

A sample is entered into the sensing unit 12 through the electrode and a test cell for accommodating an analyte binding material and an analyte, and an analyte present in the sample is bound to an analyte binding material and causes a chemical potential gradient in the test cell. The term "chemical potential gradient" may refer to a concentration gradient of an active species. It is assumed that such a gradient is present between two electrodes. In this case, a potential difference may be detected when a circuit is opened, and an electric current will flow until the gradient disappears when the circuit is closed. The chemical potential gradient may refer to a potential gradient generated by applying a potential difference or an electric current flow between the electrodes.

Figure 5:
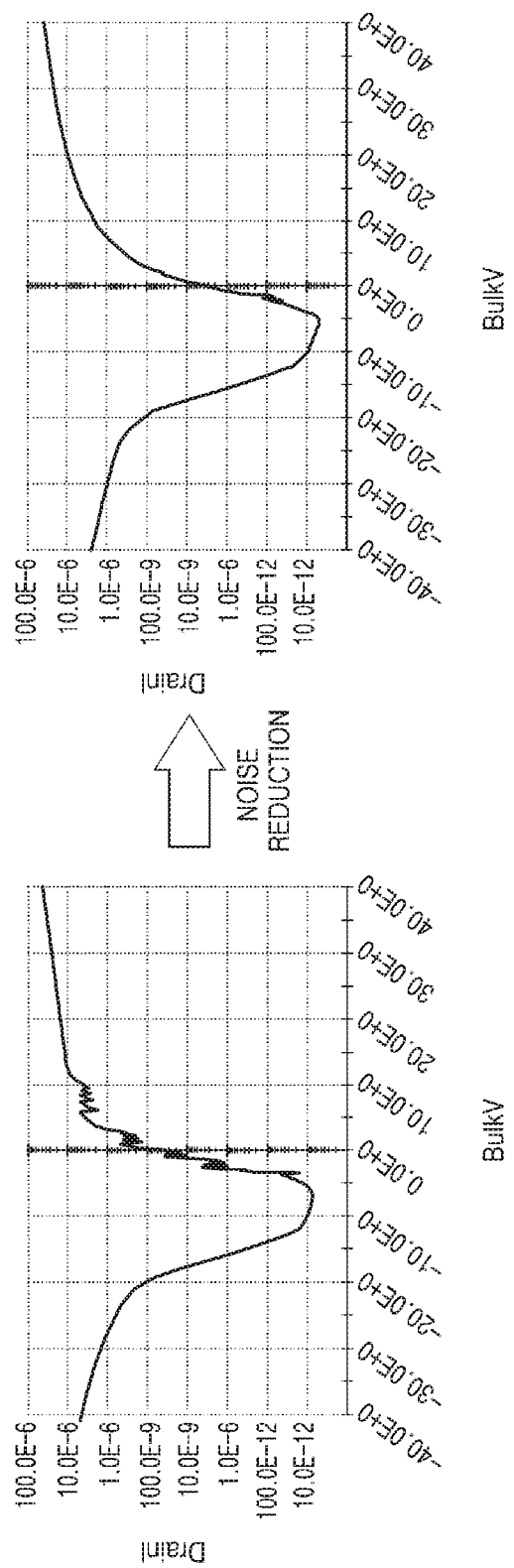
FIG. 5 is a graph illustrating a reduction of noise of a field-effect transistor according to an embodiment of the present invention.
Figure 6A:
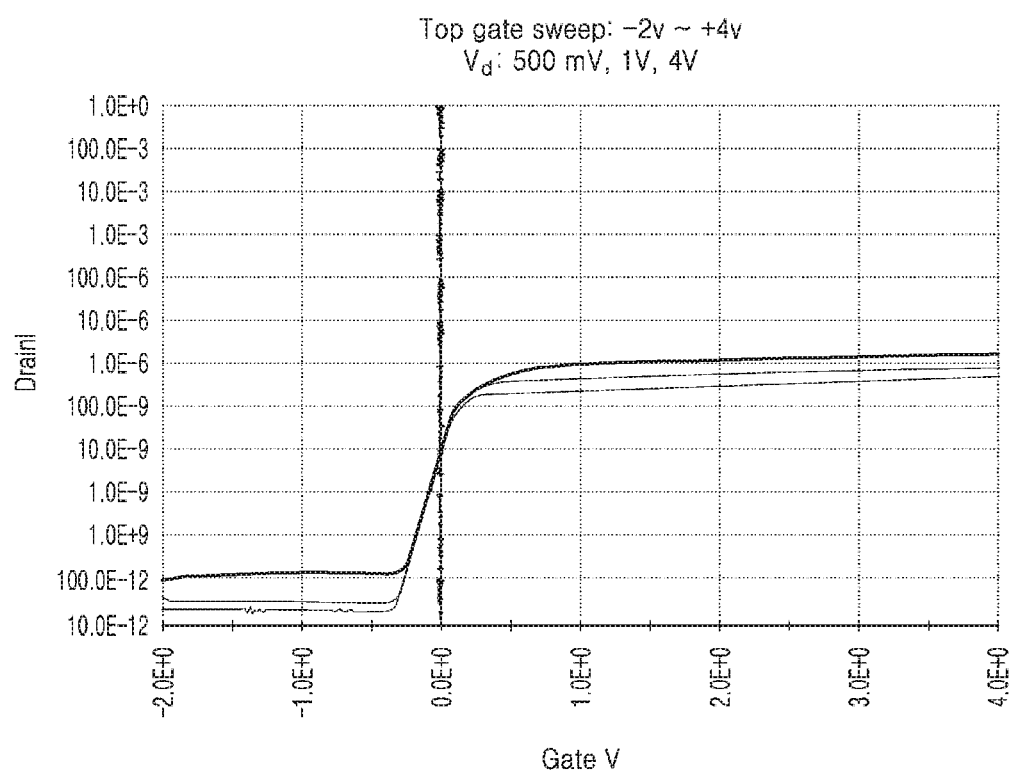
FIGS. 6A to 6C are graphs illustrating electrical characteristics of a field-effect transistor according to an embodiment of the present invention.
Figure 6B:
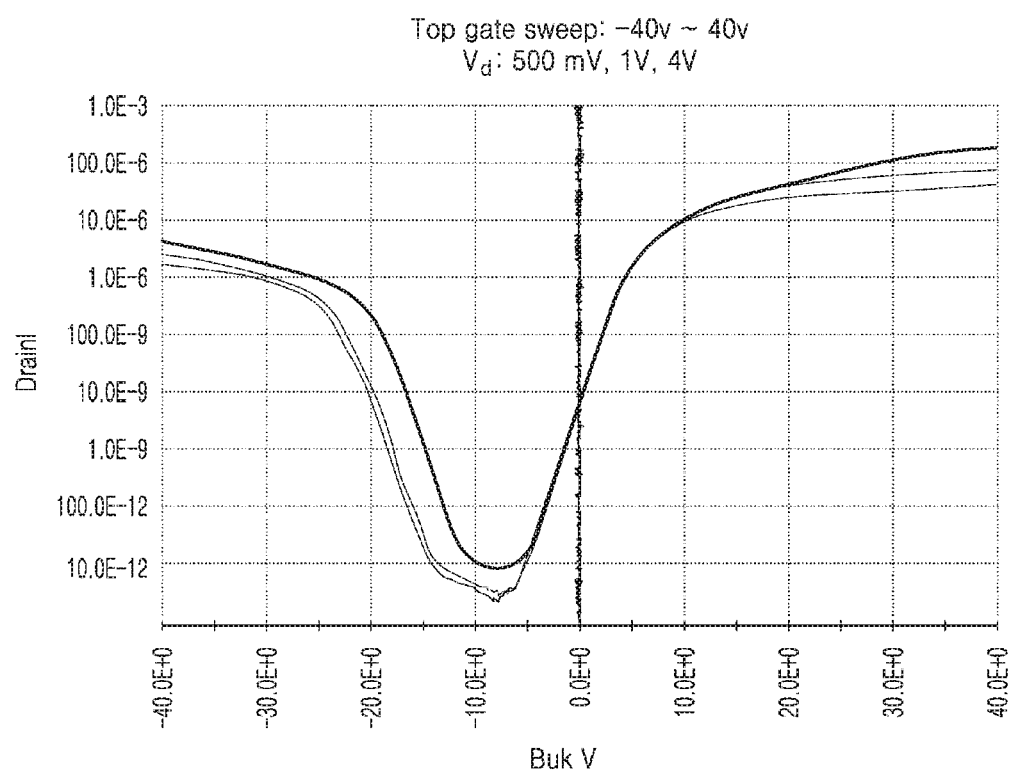
Figure 6C:
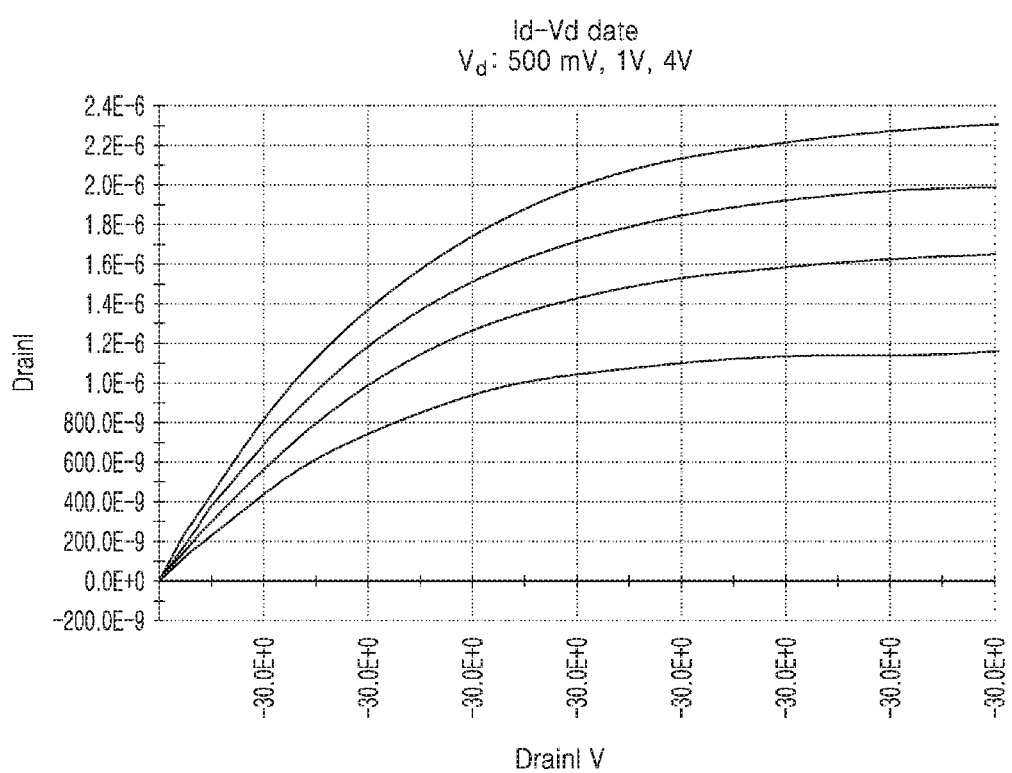
Figure 7:
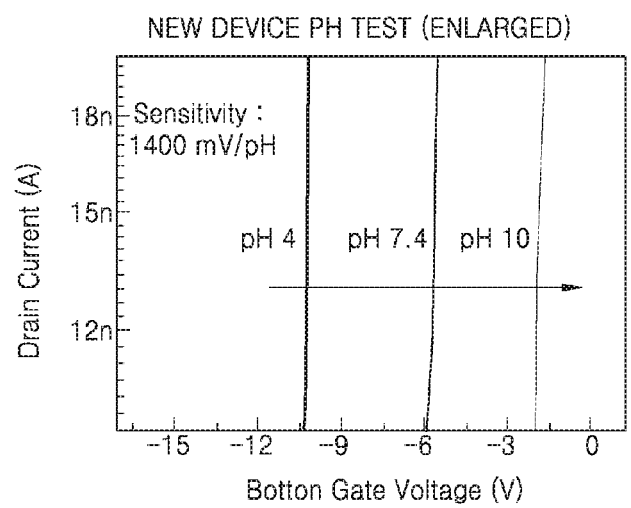
FIG. 7 is a graph illustrating a result of evaluating stability of a sensor according to an embodiment of the present invention.
Figure 8:
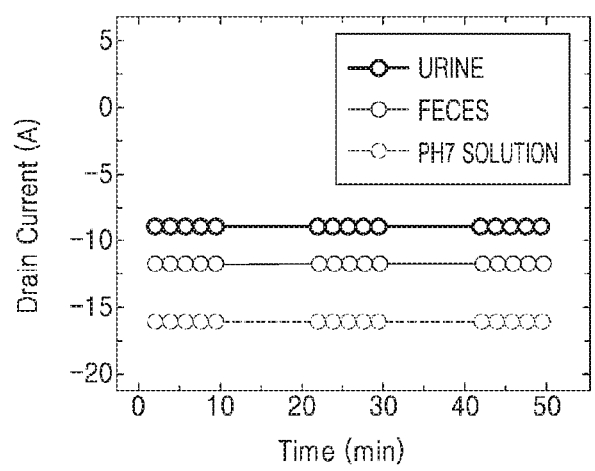
FIG. 8 is a graph illustrating a result of evaluating stability of a sensor when various specimens are applied thereto according to an embodiment of the present invention.
Figure 9A:
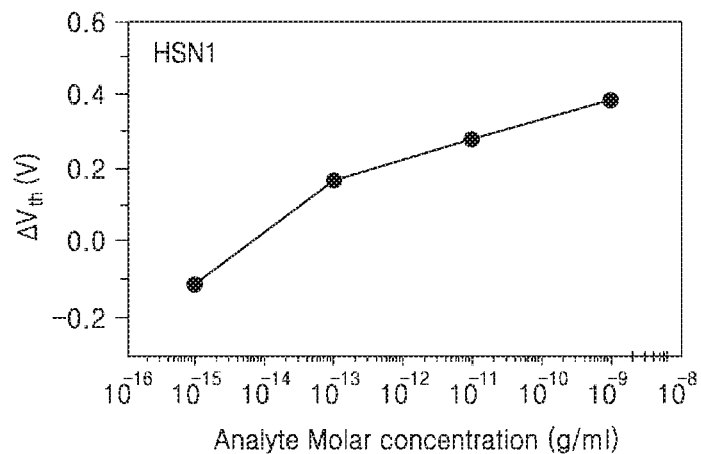
FIGS. 9A to 9c are graphs illustrating analyte detection performance of a sensor according to an embodiment of the present invention.
Figure 9B:
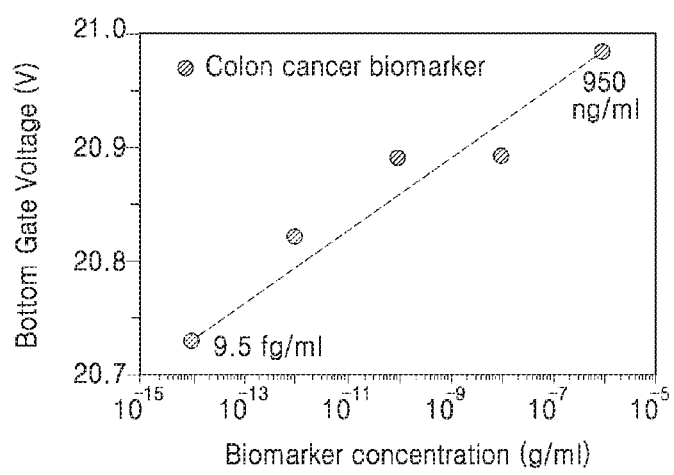
Figure 9C:
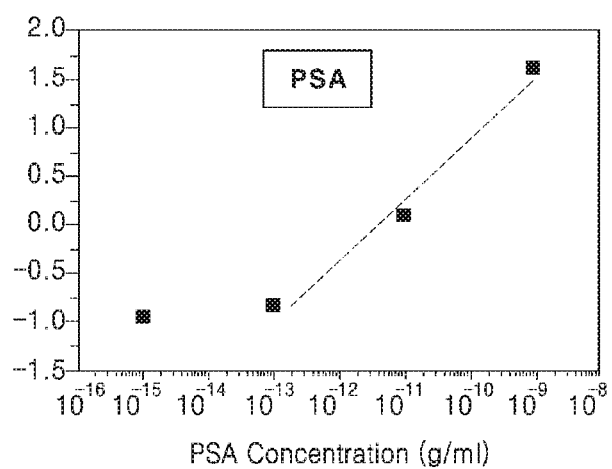

FIG. 5 is a graph illustrating a reduction of noise of the field-effect transistor 10 according to an embodiment of the present invention, and FIGS. 6A to 6C are graphs illustrating electrical characteristics of the field-effect transistor 10 according to an embodiment of the present invention. Also, FIG. 7 is a graph illustrating a result of evaluating stability of a sensor according to an embodiment of the present invention, and FIG. 8 is a graph illustrating a result of evaluating stability of a sensor when various specimens are applied thereto according to an embodiment of the present invention.

Embodiment: Analysis of Characteristics of Transistor and Characteristics of Biosensor that Uses Transistor (1) Analysis of Characteristics of Transistor As described above, a transistor was produced and then compared with a pre-existing transistor as shown in FIG. 2. In detail, a drain current of the transistor according to this embodiment was measured while a back-gate voltage was swept from −40 V to 40 V, and a result of the measurement is shown in FIG. 5.

As shown in FIG. 5, noise due to carrier scattering definitely appeared in a gate channel in the case of a FET having a pre-existing U-shaped channel, but noise due to scattering was significantly decreased in the case of a FET according to this embodiment.

Also, electrical characteristics of the FET, that is, results of sweeping a top-gate voltage from −2V to 4V and sweeping the back-gate voltage from −40V to 40V while applying 500 mV, 1 V, and 4 V thereto as a drain voltage, are shown in FIGS. 6A to 6C.

As shown in FIGS. 6A to 6C, even when a wide range of voltages were applied, the FET of the present invention showed stable response characteristics to a drain voltage, an on-off current ratio characteristic of 108, and an SS characteristic of 2.3 V/dce.

(2) Production of Biosensor and Analysis of its Characteristics

In order to produce the electrochemical sensing unit 12, glass having a thickness of about 300 nm was used as a substrate thereof. After a standard RCA cleaning, a working electrode ITO for measuring an electric potential difference in a surface of the substrate was deposited to a thickness of about 100 nm using an e-beam evaporator. Next, a $SnO_2$ film, which is an oxide layer, was deposited to a thickness of about 45 nm on an ITO layer as an insulated electrode using an RF sputter. In this case, RF power was about 50 W. Substantially, a sputtering process was performed under an Ar gas condition having a flow rate of about 20 sccm and a 3 mtorr pressure condition. Subsequently, a test cell for accommodating a sample was produced with polydimethylsiloxane (PDMS), and the sensing unit 12 was produced by attaching the test cell to the insulated electrode. In addition, a silver/silver chloride electrode was used as a reference electrode. A sensor was produced by connecting a gate pattern electrode of the produced transistor and a working electrode of the produced sensing unit 12 in a plug-in form.

PH4, pH7, and pH10 solutions were alternately used to evaluate stability of the produced sensor. Also, the stability was evaluated by measuring a signal at pH7 for 10 hours. First, how much the signal of the sensor changed was analyzed by repeatedly performing a method of reacting the sensor with the pH7 solution for 10 minutes and removing the pH7 solution, reacting the sensor with the pH10 solution for 10 minutes and removing the pH10 solution, reacting the sensor with the pH7 solution for 10 minutes and removing the pH7 solution, and then reacting the sensor with the pH4 solution for 10 minutes, and a result of the analysis is shown in FIG. 7.

FIG. 7 is a graph illustrating a result of evaluating stability a sensor according to this embodiment.

As shown in FIG. 7, it can be seen that in the case of a sensor according to this embodiment, a reference voltage was constantly measured and different solutions were alternately introduced thereto, and it can also be seen that the reference voltage changed by about 1400 mV per pH level and increased by a factor of 23.5 in comparison to 59.6 mV, which is a theoretical value.

Also, stability of the sensor in urine, feces, and the pH7 solution was measured through the reference voltage to check whether stability of the sensor according to this embodiment is secure even under various clinical specimens, and a result of the measurement is shown in FIG. 8.

FIG. 8 is a graph illustrating a result of evaluating stability of a sensor when various specimens are applied thereto according to an embodiment of the present invention.

As shown in FIG. 8, it can be seen that the sensor according to this embodiment showed 1.75% for 60 minutes and also showed long-term stability. This shows that signal stability of the sensor is ensured even when the sensor is continuously driven for 60 minutes, and demonstrates that a FET sensor produced by the proposed method can be utilized as a biosensor with high reliability even when the FET sensor is repeatedly and continuously used.

Also, additionally, a measurement was performed on an actual clinical sample in order to verify performance of the sensor. In detail, H5N1, which is one AI virus subtype, was collected through a swab method and inserted into a virus lysis buffer, and then nucleoprotein (NP) was extracted and measured for each concentration in order to detect the H5N1 virus. This measurement, which is a result measured by the sensor according to this embodiment using butter having bird feces mixed therein, demonstrated a possibility of applying a field sample without pre-processing. Also, CCSP-2, which is a colon cancer biomarker, was measured for each concentration from a blood serum sample of a clinical patient using the sensor according to this embodiment. Also, PSA, which is a prostate cancer biomarker, was measured for each concentration from urine of a clinical patient using the sensor according to this embodiment. The results are shown in FIGS. 9A to 9C.

FIGS. 9A to 9*c* are graphs illustrating analyte detection performance of a sensor according to an embodiment of the present invention.

As shown in FIGS. 9A to 9C, it can be seen that the sensor according to this embodiment is a high-sensitivity sensor capable of detecting a trace volume of an analyte and also detecting an analyte in the field without a sample being preprocessed.

While the present invention has been described with reference to the embodiments shown in the accompanying drawings, it should be understood by those skilled in the art that this embodiment is merely illustrative of the invention and that various modifications and equivalents may be made without departing from the spirit and scope of the invention. Accordingly, the technical scope of the present invention should be determined only by the technical concept of the appended claims.

DESCRIPTION OF SYMBOLS

10: field-effect transistor
12: sensing unit
20: biosensor
101: lower silicon layer
102: buried oxide layer
103: active pattern
104: gate insulating film
105: gate pattern
103*c*: channel region
103*s*: source region
103*d*: drain region
110: metal layer
110*s*: source electrode
110*d*: drain electrode
122: passivation oxide film

The invention claimed is:

1. A field-effect transistor comprising:

a lower silicon layer and a buried oxide layer disposed on the lower silicon layer;

an active pattern disposed on the buried oxide layer and including a channel region, a source region, and a drain region;

a gate pattern disposed on the active pattern to at least partially overlap the active pattern, and having a thickness of 150 to 300 nm;

a source electrode disposed in direct contact with the source region on the active pattern, and a drain electrode disposed in direct contact with the drain region on the active pattern;

a gate insulating film disposed between the active pattern and the gate pattern, and having a thickness of 10 to 20 nm;

a capping oxide layer disposed above the gate pattern, and which exposes the source region and the drain region, and has a thickness of 40 to 60 nm; and a passivation oxide film disposed on the capping oxide layer and the source region and the drain region, defining a contact hole to expose less than an entire portion of the source region and the drain region in a plan view, and having a thickness of 300 to 500 nm, wherein the active pattern has a substantially uniform thickness and includes a plurality of bridges that includes the channel region and connects the source region and the drain region in a plan view, wherein the thickness of the buried oxide layer is in a range of 300 to 1000 nm, wherein the thickness of the active pattern is in a range of 4 to 10 nm, wherein the thickness of the gate insulating film is thinner than the thickness of the buried oxide layer, wherein the lower silicon layer, the buried oxide layer, the channel region, the gate insulating film, and the gate pattern are disposed in sequence, wherein the lower silicon layer and the channel region are doped with a same type between p-type and n-type.

2. The field-effect transistor according to claim 1, wherein a side surface of the gate insulating film and a side surface of the gate pattern are coplanar.

3. The field-effect transistor according to claim 1, wherein at least one of the plurality of bridges has a width of 20 to 60 μm, and a ratio of the width of the least one of the plurality of bridges to the thickness of the active pattern is 2000 to 15000.

4. The field-effect transistor according to claim 1, wherein the source electrode and the drain electrode include TiN.

5. The field-effect transistor according to claim 4, wherein each of the source electrode and the drain electrode is formed by sequentially stacking a first layer including Ti, a second layer including TiN, a third layer including Al, and a fourth layer including TiN.

6. The field-effect transistor according to claim 1, wherein the gate pattern includes a first gate region disposed at one side of the active pattern and a second gate region extending from the first gate region to the active pattern to at least partially overlap the channel region, and the second gate region has a width of 5 to 30 μm.

7. A biosensor comprising:

an electrochemical sensing unit configured to detect an analyte in a sample; and the field-effect transistor of claim 1 electrically connected to the electrochemical sensing unit and configured to amplify a signal generated by the electrochemical sensing unit.

8. The field-effect transistor according to claim 6,
wherein the passivation oxide film is disposed between and in direct contact with the source electrode and the second gate region and disposed between and in direct contact with the drain electrode and the second gate region, and the source electrode and the drain electrode are on opposite sides of the second gate region.

9. The field-effect transistor according to claim 1,
wherein the gate pattern is formed by sequentially stacking a first layer including Ti, a second layer including TiN, a third layer including Al, and a fourth layer including TiN, wherein a thickness of the third layer is larger than any of the thicknesses of the first layer, the second layer and the third layer.

* * * * *